United States Patent
Lee et al.

(10) Patent No.: US 12,190,954 B2
(45) Date of Patent: Jan. 7, 2025

(54) MEMORY DEVICE AND PROGRAM METHOD OF GROUND SELECT TRANSISTORS

(71) Applicant: SAMSUNG ELECTRONICS CO., LTD., Suwon-si (KR)

(72) Inventors: Hanjun Lee, Seoul (KR); Byungsoo Kim, Anyang-si (KR); Sangwan Nam, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 166 days.

(21) Appl. No.: 17/817,408

(22) Filed: Aug. 4, 2022

(65) Prior Publication Data

US 2023/0096057 A1    Mar. 30, 2023

(30) Foreign Application Priority Data

Sep. 27, 2021  (KR) .................. 10-2021-0127543

(51) Int. Cl.
G11C 16/10  (2006.01)
G11C 16/04  (2006.01)
G11C 16/34  (2006.01)

(52) U.S. Cl.
CPC .......... *G11C 16/10* (2013.01); *G11C 16/0483* (2013.01); *G11C 16/3459* (2013.01)

(58) Field of Classification Search
CPC .. G11C 16/10; G11C 16/0483; G11C 16/3459
See application file for complete search history.

(56) References Cited

U.S. PATENT DOCUMENTS

| | | |
|---|---|---|
| 7,099,196 B2 | 8/2006 | Suh et al. |
| 7,468,924 B2 | 12/2008 | Kwon |
| 7,679,133 B2 | 3/2010 | Son et al. |
| 8,553,466 B2 | 10/2013 | Han et al. |
| 8,559,235 B2 | 10/2013 | Yoon et al. |
| 8,654,587 B2 | 2/2014 | Yoon et al. |
| 8,755,227 B2 | 6/2014 | Lin et al. |
| 9,275,743 B1 | 3/2016 | Lee et al. |
| 9,412,450 B2 | 8/2016 | Lee et al. |
| 9,536,613 B2 | 1/2017 | Lee |

(Continued)

FOREIGN PATENT DOCUMENTS

| | | |
|---|---|---|
| KR | 10-0769258 | 10/2007 |
| KR | 10-1418957 | 7/2014 |
| KR | 10-2068163 | 1/2020 |

OTHER PUBLICATIONS

EESR issued Feb. 8, 2023 in corresponding EP Patent Application No. 22193835.0.

*Primary Examiner* — Vanthu T Nguyen
(74) *Attorney, Agent, or Firm* — F. Chau & Associates, LLC

(57) ABSTRACT

A program method includes applying a first voltage to a plurality of bit lines, applying a second voltage to a common source line (CSL), and performing a program loop by applying a program voltage and a verify voltage to each of a plurality of ground selection lines (GSLs) positioned between one bit line among the plurality of bit lines and the CSL. The program loop is performed on both a program completed cell in which a program is completed by applying the program voltage and a program target cell.

9 Claims, 14 Drawing Sheets

(56) References Cited

U.S. PATENT DOCUMENTS

| | | |
|---|---|---|
| 10,153,051 B1 | 12/2018 | Chen et al. |
| 10,163,511 B2 | 12/2018 | Nam et al. |
| 10,636,492 B2 | 4/2020 | Baek et al. |
| 2006/0133155 A1 | 6/2006 | Fujita et al. |
| 2008/0123436 A1 | 5/2008 | Byeon |
| 2011/0211392 A1 | 9/2011 | Kim et al. |
| 2011/0233648 A1 | 9/2011 | Seol et al. |
| 2012/0281475 A1 | 11/2012 | Oh et al. |
| 2016/0035424 A1 | 2/2016 | Chang et al. |
| 2023/0038152 A1* | 2/2023 | Lee .................. G11C 16/14 |

* cited by examiner

MEMORY DEVICE AND PROGRAM METHOD OF GROUND SELECT TRANSISTORS

CROSS-REFERENCE TO RELATED APPLICATION

This application claims priority under 35 U.S.C. § 119 to Korean Patent Application No. 10-2021-0127543, filed on Sep. 27, 2021, in the Korean Intellectual Property Office, the disclosure of which is incorporated by reference herein in its entirety.

TECHNICAL FIELD

Embodiments of the present disclosure relate to a memory device and a programming method, and more particularly, to a programming method for cells connected to a ground selection line.

DISCUSSION OF RELATED ART

A semiconductor memory device, for example, a NAND flash memory, includes a plurality of memory cells. The memory cell may store data having a value of 1 or 0 according to the distribution of a threshold voltage.

For example, in the program process, a low voltage (e.g., a ground voltage) may be applied to a bit line to which the program cell is connected, and a high voltage (e.g., a power supply voltage) may be applied to a bit line to which a program inhibit cell is connected.

A program voltage may be applied to a selected word line to which the program cell is connected, and a pass voltage may be applied to an unselected word line. As a result, the program cell may have a threshold voltage corresponding to a data value of 0, and the program inhibit cell may have an erase state, that is, a threshold voltage corresponding to data value of 1.

SUMMARY

Embodiments of the present disclosure provide a memory device for programming a cell connected to a ground selection line and a programming method thereof.

According to an aspect of the present disclosure, there is provided a program method including: applying a first voltage to a plurality of bit lines and applying a second voltage to a common source line (CSL); and performing a program loop by applying a program voltage and a verify voltage to each of a plurality of ground selection lines (GSLs) positioned between one bit line among the plurality of bit lines and the CSL, wherein the program loop is configured to be performed on both a program completed cell in which a program is completed by applying the program voltage and a program target cell.

According to an aspect of the present disclosure, there is provided a program method including: applying a first voltage to the plurality of bit lines and applying a second voltage to a CSL; and applying a program voltage to each of a plurality of GSL positioned between one of the plurality of bit lines and the CSL and omitting a verification operation.

According to an aspect of the present disclosure, there is provided a memory device including: a plurality of bit lines connected to first ends of a plurality of cell strings; a CSL connected to second ends of the plurality of cell strings; and a memory cell array including a plurality of GSL cells connected between the plurality of bit lines and the CSL; and a control logic configured to apply a first voltage to the plurality of bit lines, apply a second voltage to the CSL, apply a program voltage and a verify voltage to the plurality of GSLs to cause threshold voltage levels of the plurality of GSL cells to reach a reference level, without utilizing a verification result of applying the verify voltage.

BRIEF DESCRIPTION OF THE DRAWINGS

The above and other features of the present disclosure will become more apparent by describing in detail embodiments thereof with reference to the accompanying drawings, in which.

DETAILED DESCRIPTION OF THE EMBODIMENTS

Figure 1:
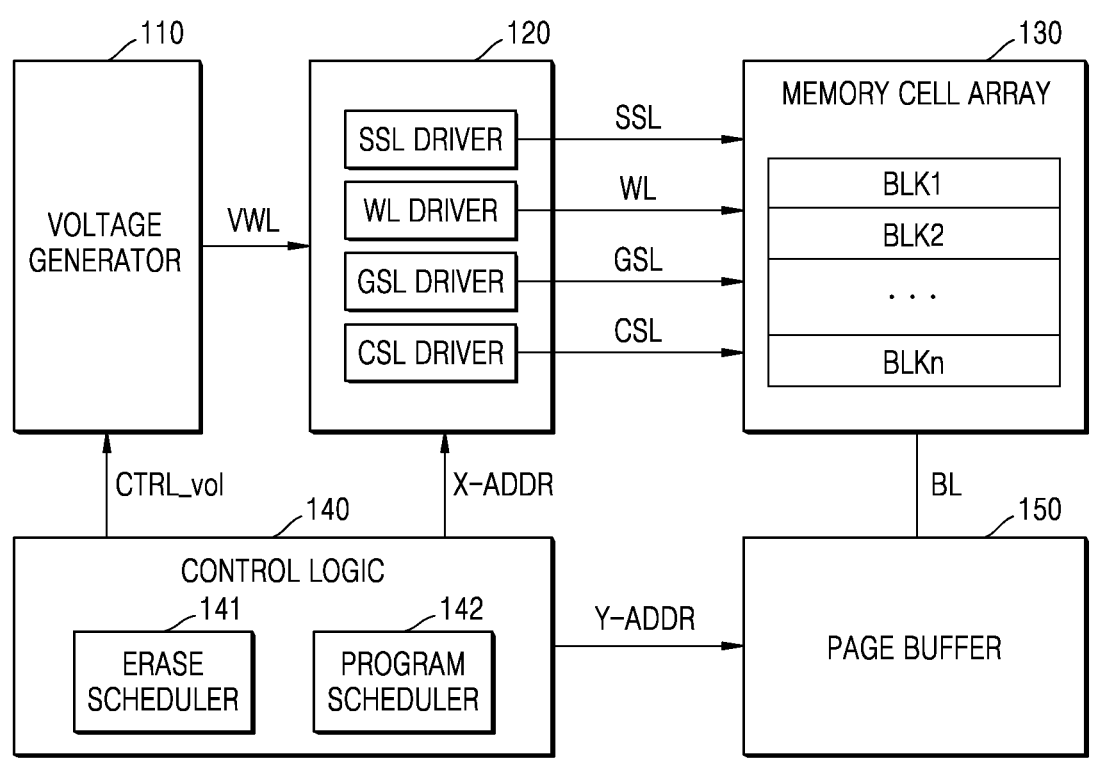
FIG. 1 is a block diagram illustrating a memory device according to an example embodiment of the present disclosure.

Embodiments of the present disclosure will be described more fully hereinafter with reference to the accompanying drawings. Like reference numerals may refer to like elements throughout the accompanying drawings.

FIG. 1 is a block diagram illustrating a memory device according to an example embodiment of the present disclosure.

Referring to FIG. 1, a memory device 10 may include a voltage generator 110, a row decoder 120, a memory cell array 130, a control logic circuit 140, and a page buffer 150. In an example embodiment, the memory device 10 may further include a memory interface circuit, and may further include a column logic, a pre-decoder, a temperature sensor, a command decoder, an address decoder, etc.

The voltage generator 110 may generate various types of voltages for performing operations such as, for example, program, read, and erase operations, based on a voltage control signal CTRL_vol. For example, the voltage generator 110 may generate a program voltage, a read voltage, a program verify voltage, an erase voltage, etc. as a word line voltage VWL. In addition, the word line voltage VWL may be provided to a plurality of string selection lines SSL, a plurality of word lines WL, a plurality of ground selection lines GSL, and a common source line CSL.

The row decoder 120 may select one of the plurality of word lines WL in response to a row address X-ADDR and may select one of the plurality of string selection lines SSL. For example, the row decoder 120 may apply a program voltage and a program verify voltage to the selected word line WL during a program operation, and may apply a read voltage to the selected word line WL during a read operation.

The row decoder 120 may include a driving circuit that selects any one of the plurality of string selection lines SSL, the plurality of word lines WL, and the plurality of ground selection lines GSL. For example, a string selection line driver, a word line driver, a ground selection line driver, and a common source line driver may be respectively connected to a string selection line SSL, a word line WL, a ground selection line GSL, and a common source line CSL, and may supply a voltage to each of the string selection line SSL, the word line WL, the ground selection line GSL, and the common source line CSL.

The memory cell array 130 may include a plurality of memory blocks BLK1 to BLKn (n is a positive integer), and each of the plurality of memory blocks BLK1 to BLKn may include a plurality of memory cells. The memory cell array 130 may be connected to the page buffer 150 through a plurality of bit lines BL, and may be connected to the row decoder 120 through the word lines WL, the string selection lines SSL, and the ground selection lines GSL.

In an example embodiment, the memory cell array 130 may include a 3D memory cell array, and the 3D memory cell array may include a plurality of NAND strings. Each NAND string may include memory cells respectively connected to word lines WL stacked vertically on a substrate. U.S. Pat. Nos. 7,679,133, 8,553,466, 8,654,587, 8,559,235, and US Patent Application Publication No. 2011/0233648 are incorporated by reference herein in their entireties. In an example embodiment, the memory cell array 130 may include a 3D memory cell array, and the 3D memory cell array may include a plurality of NAND strings.

The memory cell array 130 may include a memory cell connected to a word line WL, a cell transistor connected to a string selection line SSL, and a cell transistor connected to a ground selection line GSL. For convenience of description, in the present specification, a cell transistor connected to a string selection line is referred to as an SSL cell, and a cell transistor connected to a ground selection line is referred to as a GSL cell.

Similar to the memory cell, the SSL cell and the GSL cell may be programmed by receiving a program voltage, and may form a threshold voltage distribution. For example, to perform an erase operation, the threshold voltage distribution of the GSL cell should be maintained within a reference range. Accordingly, when the threshold voltage of the GSL cell is out of the reference range, the operation of programming the GSL cell may be performed again.

The control logic circuit 140 may generally control various operations in the memory device 10. The control logic circuit 140 may output various control signals in response to a command CMD and/or an address ADDR from the memory interface circuit. For example, the control logic circuit 140 may output the voltage control signal CTRL_vol, the row address X-ADDR, and a column address Y-ADDR.

The control logic circuit 140 may include an erase scheduler 141 and a program scheduler 142. The erase scheduler 141 may also be referred to as an erase scheduler circuit, and the program scheduler 142 may also be referred to as a program scheduler circuit. The erase scheduler 141 may schedule a series of operations for performing the erase operation, and the program scheduler 142 may schedule a series of operations for performing the program operation. For example, the erase scheduler 141 may control an operation of applying a preset voltage to the string selection lines SSL and the ground selection lines GSL in advance to erase the memory blocks. For example, the program scheduler 142 may control operations to program and verify GSL cells. For example, the program scheduler 142 may control a series of operations of applying a program voltage to the GSL cells, applying a verify voltage, and checking whether the threshold voltage of the GSL cells is within a reference range.

The page buffer 150 may include a plurality of page buffers, and the plurality of page buffers may be respectively connected to memory cells through the plurality of bit lines BL. The page buffer 150 may select at least one bit line BL among the bit lines BL in response to the column address Y-ADDR. The page buffer 150 may operate as a write driver or a sense amplifier according to an operation mode. For example, during a program operation, the page buffer 150 may apply a bit line voltage corresponding to data to be programmed to a selected bit line. During a read operation, the page buffer 150 may sense data stored in the memory cell by sensing the current or voltage of the selected bit line. Also, the page buffer 150 may apply a constant voltage to the bit line to program the GSL cells.

Figure 2:
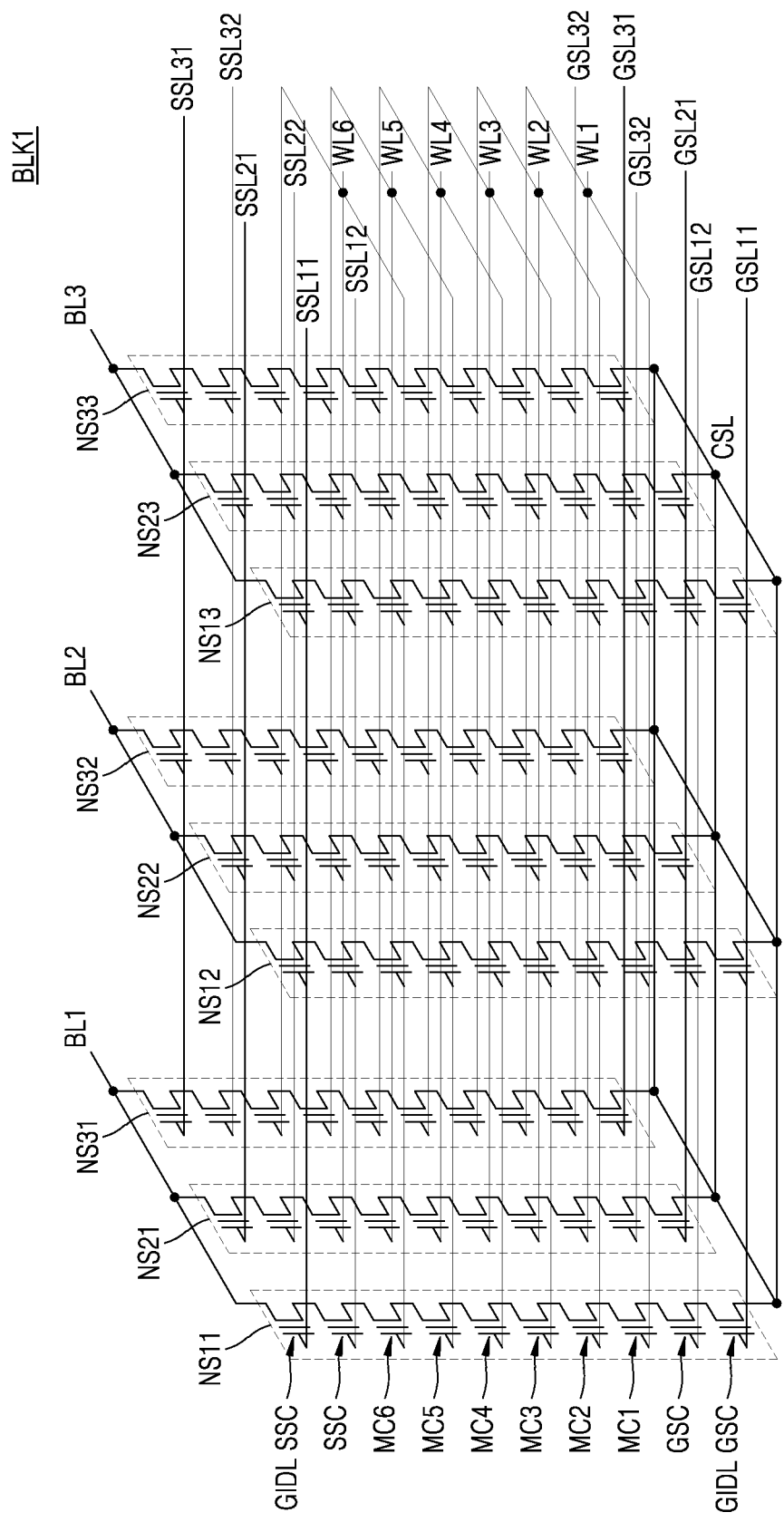
FIG. 2 is a circuit diagram illustrating a memory cell array according to an example embodiment of the present disclosure.

FIG. 2 is a circuit diagram illustrating a memory cell array according to an example embodiment of the present disclosure.

Referring to FIG. 2, the memory block BLK1 may correspond to one of the plurality of memory blocks BLK1 to BLKn of FIG. 1, and may include a plurality of NAND strings NS11 to NS33, a plurality of ground selection lines GSL11 to GSL32, a plurality of string selection lines SSL11 to SSL32, and a common source line CSL. Here, the number of NAND strings, the number of word lines WL, the number of bit lines BL, the number of ground selection lines GSL, and the number of string selection lines SSL may be variously changed according to embodiments.

The NAND strings NS11, NS21, and NS31 may be provided between the first bit line BL1 and the common source line CSL, the NAND strings NS12, NS22, and NS32 may be provided between the second bit line BL2 and the common source line CSL, and the NAND strings NS13, NS23, and NS33 may be provided between the third bit line BL3 and the common source line CSL. Each NAND string (e.g., NS11) may include a string select transistor SSC, a plurality of memory cells MC1 to MC6, and a ground select transistor GSC connected in series. In this case, as described above, the string select transistor SSC may be referred to as an SSL cell SSC, and the ground select transistor GSC may be referred to as a GSL cell GSC. In addition, each NAND string may further include a GIDL SSL cell GIDL SSC and a GIDL GSL cell GIDL GSC. The programming of the GSL cell GSC will be described in further detail below. The plurality of ground selection lines GSL may be connected to respective GSL cells and may also be connected to a GIDL GSL cell GIDL GSC. In this case, the levels of the program voltage and the verify voltage applied to the GIDL ground selection lines GSL11, GSL21, and GSL31 may be different.

In addition, the GIDL string selection line GIDL SSL and the GIDL ground selection line GIDL GSL may mean word lines in which a gate induced drain leakage (GIDL) phenomenon occurs. As the memory block BLK1 includes a GIDL string selection line GIDL SSL and a GIDL ground selection line GIDL GSL, a GIDL erase method may be used instead of a bulk erase method. Bulk erase includes setting gate, source and drain voltages such that a negative bias is applied to the control gate of the memory cell and a positive bias is applied to the channel layer. GIDL erase may include an operation of erasing data in the selected memory cell by transmitting holes generated by the GIDL current to the selected memory cell.

For example, if the GSL cell GSC is the program target cell, a high voltage for programming is applied to the ground selection line GSL, and the same level of voltage may be applied to each of the remaining word lines WL1 to WL6, GIDL string selection lines GIDL SSL, and GIDL ground selection lines GIDL GSL that are not the program target.

The SSL cell SSC may be connected to the corresponding string selection lines SSL1 to SSL3. The plurality of memory cells MC1 to MC6 may be respectively connected to corresponding word lines WL1 to WL6. The GSL cell GSC may be connected to the corresponding ground selection lines GSL12, GSL22, and GSL32. The SSL cell SSC may be connected to the corresponding bit lines BL1 to BL3, and the GSL cell GSC may be connected to the common source line CSL.

In FIG. 2, each string is illustrated as including one SSL cell, but the example embodiments of the present disclosure are not limited thereto. For example, according to example embodiments, each string may further include an upper SSL cell and a lower SSL cell connected in series. In addition, in FIG. 2, each string is illustrated as including one GSL cell, but the example embodiments of the present disclosure are not limited thereto. For example, according to example embodiments, each string may further include an upper GSL cell and a lower GSL cell connected in series. In this case, the upper GSL cell may be connected to a ground selection line GSL, and the lower GSL cell may be commonly connected to the common source line CSL.

Figure 3:
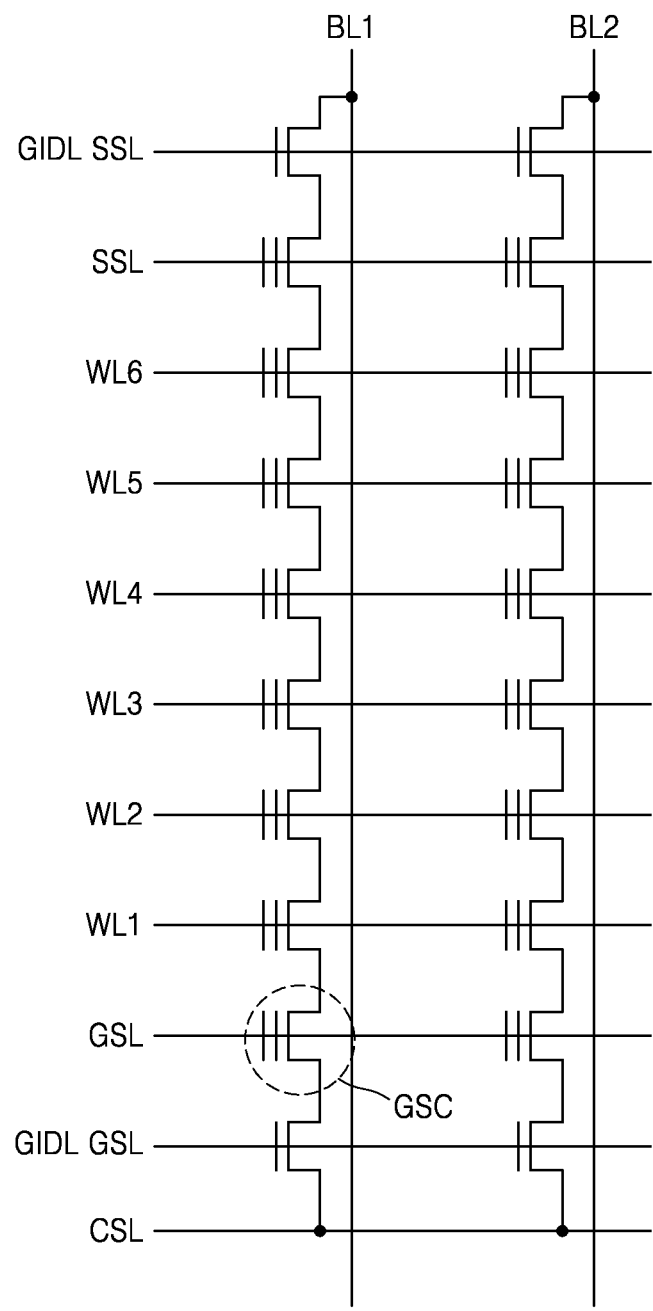
FIG. 3 is a circuit diagram illustrating a ground selection line (GSL) cell according to an example embodiment of the present disclosure.
Figure 4:
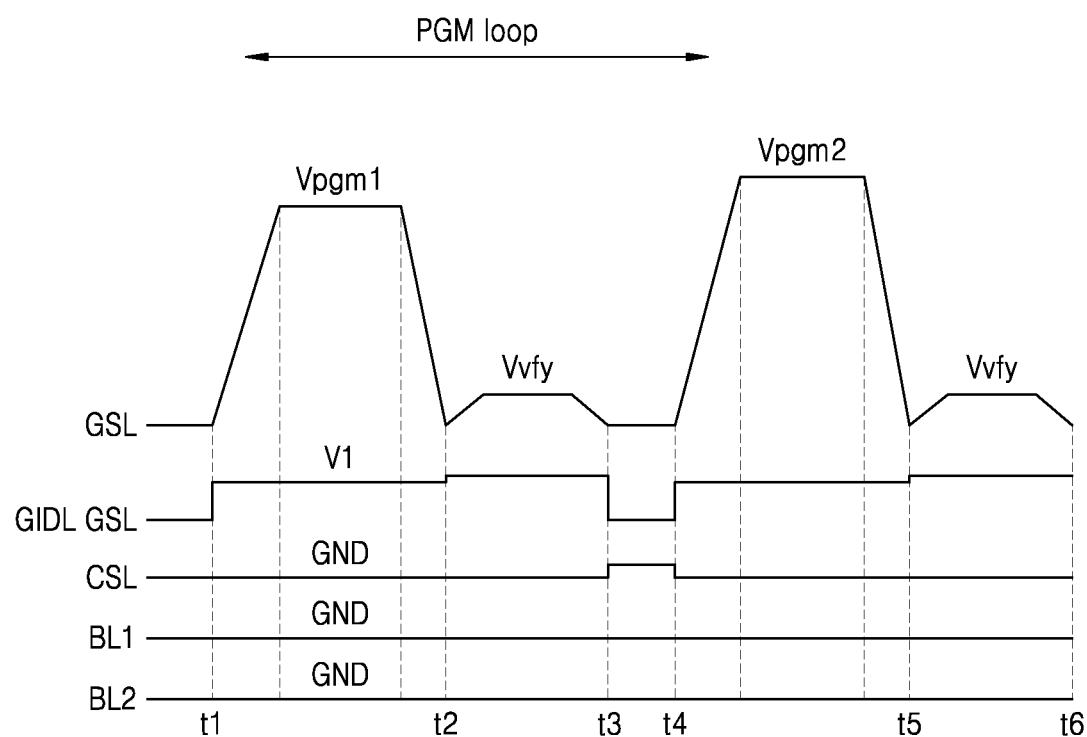
FIG. 4 is a timing diagram illustrating a method of programming a GSL cell according to an example embodiment of the present disclosure.

FIG. 3 is a circuit diagram illustrating a GSL cell according to an example embodiment of the present disclosure. FIG. 4 is a timing diagram illustrating a method of programming a GSL cell according to an example embodiment of the present disclosure.

Referring to FIG. 3, the first and second bit lines BL1 and BL2 may be connected to the GIDL string selection line GIDL SSL, the string selection line SSL, first to sixth word lines WL1 to WL6, the ground selection line GSL, the GIDL ground selection line GIDL GSL, and the common source line CSL, respectively. In this case, the GSL cell GSC connected to the ground selection line GSL of the first bit line BL1 may be programmed.

Referring to FIG. 4, similar to the memory cell, an incremental step pulse program (ISPP) method may be used to program the GSL cell GSC. In the ISPP method, the program is repeatedly performed while increasing the program voltage by the step voltage. Since the characteristics of the plurality of memory cells are different, as a result of one-time application of the program voltage, a programmed cell may coexist with a non-programmed cell. This result may be confirmed by applying the verify voltage after the application of the program voltage. Accordingly, a higher program voltage may be applied to cells in which programming is not completed. At this time, the already programmed cell is set as the program inhibit cell to prevent the threshold voltage distribution from spreading.

That is, by applying the program voltages Vpgm1 and Vpgm2 to the GSL cell GSC and then applying the verify voltage Vvfy, it may be checked whether the threshold voltage of the GSL cell GSC passes the verify voltage Vvfy. When the threshold voltage of the GSL cell GSC is less than the verify voltage Vvfy, that is, when the GSL cell GSC is a fail cell, the program voltages Vpgm1 and Vpgm2 are increased, and the program operation and verification operation for the GSL cell GSC may be repeated. In this case, the program operation of applying the program voltages Vpgm1 and Vpgm2 to the GSL cell GSC and the verification operation of applying the verify voltage Vvfy to the GSL cell GSC may be referred to as a program loop PGM loop. For example, one program loop PGM loop may be performed at first to fourth time points t1 to t4.

At the first time point t1, a first voltage V1 may be applied to the GIDL ground selection line GIDL GSL. The difference between the first voltage V1 and the voltage applied to the ground selection line GSL may be within the first range. For example, the first voltage V1 may be about 6 V. A first program voltage Vpgm1 may be applied to the ground selection line GSL. At this time, the ground voltage GND may be applied to the common source line CSL and the ground voltage GND may be applied to the first bit line BL1 connected to the GSL cell GSC and the second bit line BL2 adjacent to the first bit line BL1. A series of operations performed at the first time point t1 may be referred to as a program operation.

At the second time point t2, the program operation may be terminated and a verification operation may be performed. For example, the verify voltage Vvfy may be applied to the ground selection line GSL. In this case, the ground voltage GND applied to the common source line CSL and the first and second bit lines BL1 and BL2 may be maintained. Whether the GSL cell GSC passes or fails may be determined by applying the verify voltage Vvfy.

When the GSL cell GSC is passed, that is, when the threshold voltage of the GSL cell GSC is equal to or greater than the verify voltage Vvfy, it is not necessary to apply the program voltages Vpgm1 and Vpgm2 to the GSL cell GSC. When the GSL cell GSC fails, that is, when the threshold voltage of the GSL cell GSC is less than the verify voltage Vvfy, the threshold voltage of the GSL cell GSC may be increased by applying the program voltages Vpgm1 and Vpgm2. However, according to an example embodiment of the present disclosure, even if pass or fail of the GSL cell GSC is determined through the verification operation, the program operation of the GSL cell GSC may be continuously performed.

For example, one program loop PGM loop is completed at the first to fourth time points t1 to t4, and the program voltage is increased so that the program loop PGM loop may be performed again. That is, at the fourth time point t4, the second program voltage Vpgm2 may be applied to the ground selection line GSL. The second program voltage Vpgm2 may be at a higher level than the first program voltage Vpgm1. In the new program loop, the ground voltage GND may be applied to the common source line CSL, as well as to the first and second bit lines BL1 and BL2. At the fifth time point t5, the verify voltage Vvfy may be applied to the ground selection line GSL. According to example embodiments, the magnitude of the verify voltage Vvfy does not change as the program loop is performed, and may be maintained to be constant.

According to an example embodiment of the present disclosure, the program may be repeatedly performed even for the GSL cell GSC, that is, the pass cell, for which the verification result program has been completed. When the threshold voltage of all GSL cells GSC becomes equal to or higher than the verify voltage Vvfy, the verification operation may be performed to confirm that there is no longer a GSL cell GSC that is a target of the program.

According to an example embodiment of the present disclosure, the purpose of the verification operation may be distinguished from the purpose of confirming the threshold voltage of each of the GSL cells GSC, stopping the program operation on pass cells, and performing the program operation only on fail cells. Accordingly, to inhibit a program operation on the pass cell, an operation of supplying a high voltage, for example, a power voltage, to a bit line connected to the pass cell may be omitted.

Figure 5:
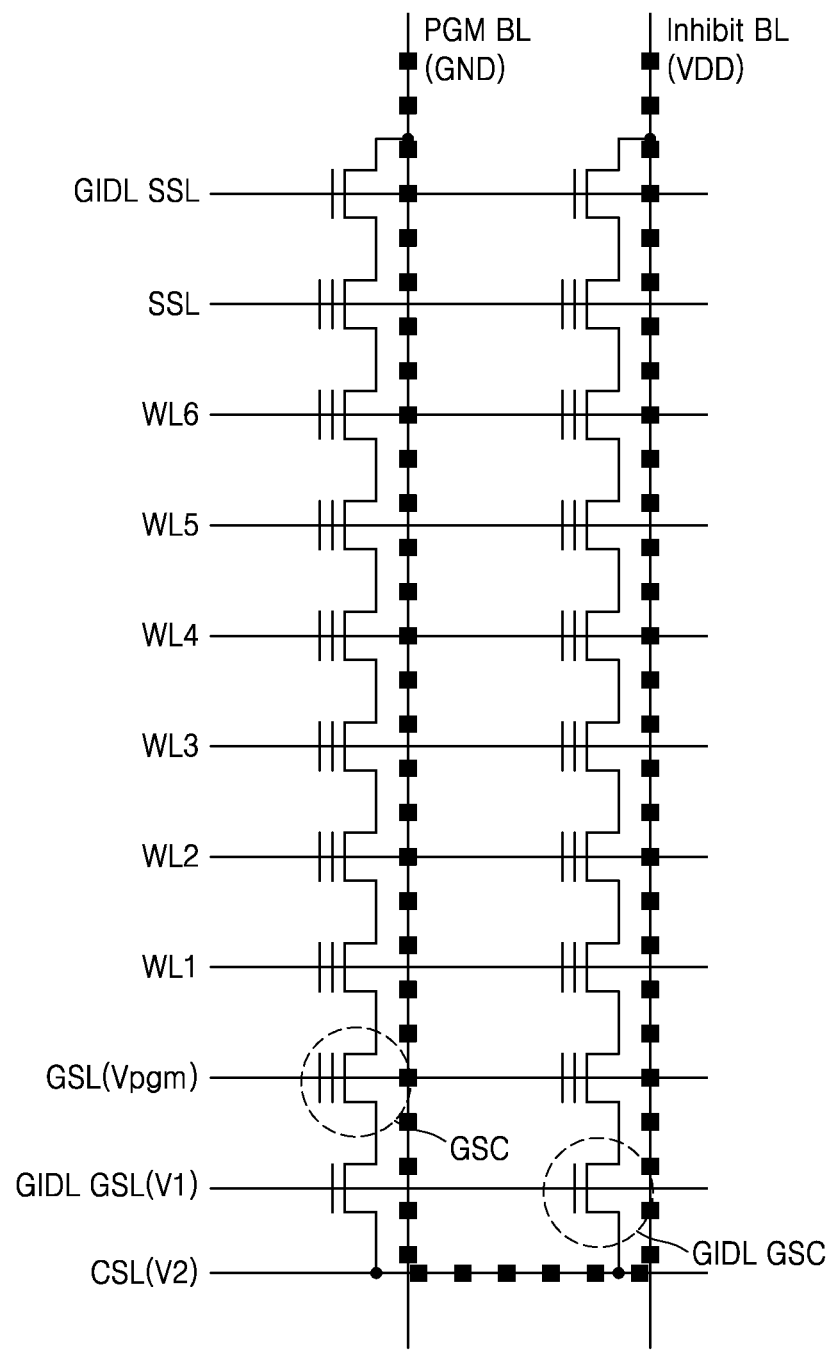
FIG. 5 is an exemplary diagram illustrating a method of programming a GSL cell according to a comparative example.

FIG. 5 is an exemplary diagram illustrating a method of programming a GSL cell according to a comparative example.

Referring to FIG. 5, as a result of performing the program loop, the GSL cell connected to the first bit line may be determined as a fail cell, and the GSL cell connected to the second bit line may be determined as a pass cell. According to the comparative example, the first bit line connected to the fail cell may be determined as the program bit line PGM BL, and the second bit line connected to the pass cell may be determined as the inhibit bit line Inhibit BL. In this case, a high voltage may be applied to the inhibit bit line Inhibit BL. For example, the high voltage may be the power supply voltage VDD.

To perform a program operation on the GSL cell GSC, a low voltage, e.g., a ground voltage GND, may be applied to the program bit line PGM BL. A first voltage V1 may be applied such that the program voltage is applied to the ground selection line GSL and the difference from the program voltage applied to the ground selection line GSL to the GIDL ground selection line GIDL GSL is within the first range. For example, the program voltage may be about 15 V and the first voltage V1 may be about 6 V. However, this is only an example, and embodiments of the present disclosure are not limited thereto. A second voltage V2 may be applied to the common source line CSL, and the second voltage V2 may be, for example, about 1.5 V.

According to the comparative example, as the first voltage V1 is applied to the GIDL ground selection line GIDL GSL, the gate of the GIDL GSL cell GIDL GSC connected to the second bit line, that is, the inhibit bit line Inhibit BL, may be opened, a source of the GIDL GSL cell GIDL GSC may include a voltage of the inhibit bit line Inhibit BL, and a drain of the GIDL GSL cell GIDL GSC may include a voltage of the program bit line PGM BL. Accordingly, a phenomenon (e.g., short path) in which channels of two bit lines are connected may occur.

To prevent this, according to embodiments of the present disclosure, the inhibit bit line Inhibit BL is not distinguished from the program bit line PGM BL, and both bit lines may be treated as the program bit line PGM BL. Accordingly, a short path phenomenon may be prevented while maintaining the voltage difference between the ground selection line GSL and the GIDL ground selection line GIDL GSL within the reference range. According to example embodiments, not distinguishing between the inhibit bit line Inhibit BL and the program bit line PGM BL refers to the verification result of the verification operation not being utilized in the next program loop. Thus, according to example embodiments, the verification operation may be omitted in the program loop.

Figure 6:
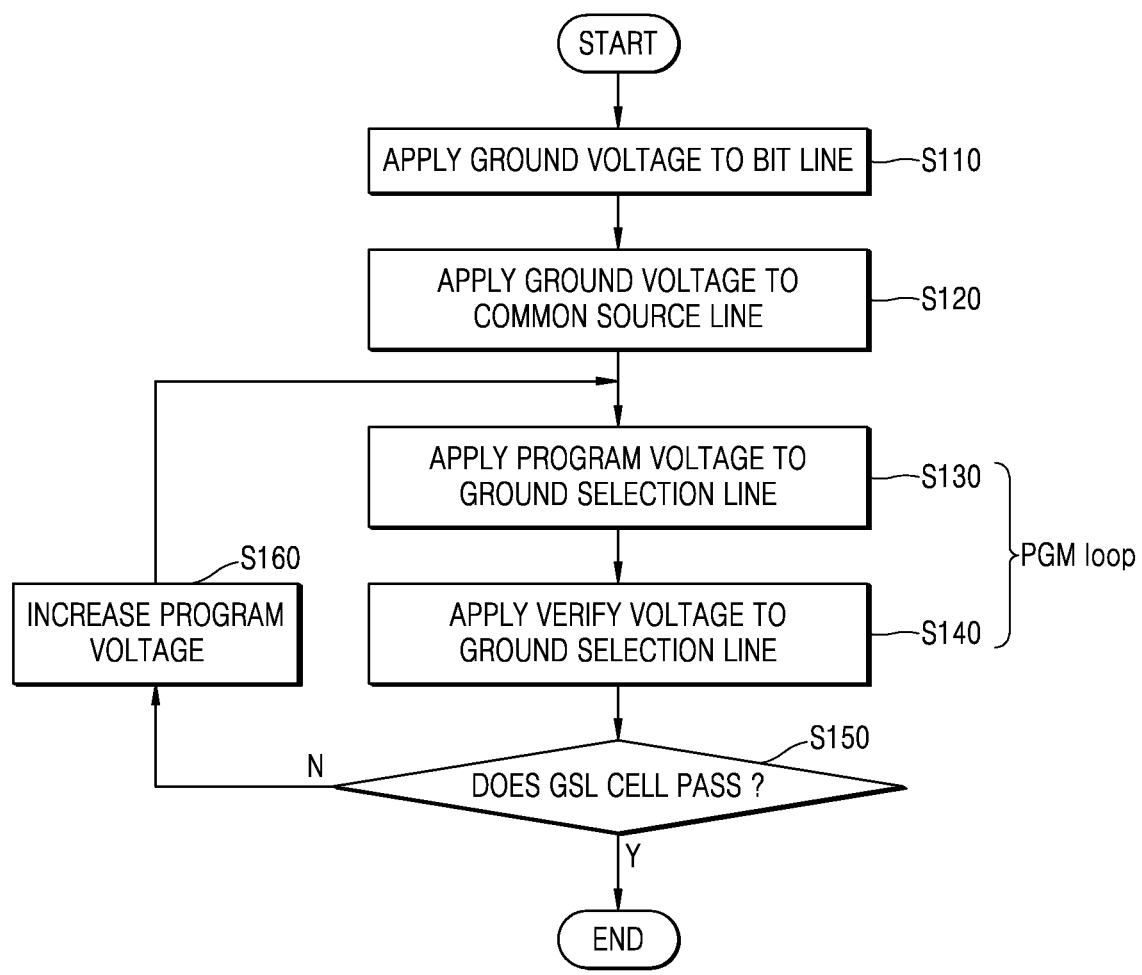
FIG. 6 is a flowchart illustrating a method of programming a GSL cell according to an example embodiment of the present disclosure.

FIG. 6 is a flowchart illustrating a method of programming a GSL cell according to an example embodiment of the present disclosure.

Referring to FIG. 6, a ground voltage may be applied to the bit line (S110). A ground voltage may be applied to the common source line (S120). The order in which operations S110 and S120 are performed is not limited to the order shown in FIG. 6. A program voltage may be applied to the ground selection line connected to the GSL cell, and a verify voltage may be applied to the GSL cell (S130 and S140). Operations S130 and S140 may correspond to the program loop PGM loop. As the verify voltage is applied to the GSL cell, as a result of the verification, whether the GSL cell has passed may be checked (S150). When the GSL cell has passed, the program loop may end. When the GSL cell fails, the program voltage is increased (S160), and a program loop may be repeatedly performed based on the increased program voltage. According to an example embodiment of the present disclosure, S160 and a program loop thereafter may be identically performed on both the passed GSL cell and the failed GSL cell in operation S150. That is, according to an embodiment of the present disclosure, to repeatedly perform the program loop only on the GSL cells that failed in operation S150, an operation of setting a failed cell as a program cell and setting a passed cell as an inhibit cell may be omitted. As an example, the program loop may be repeatedly performed until the number of pass cells exceeds a preset criterion.

Figure 7:
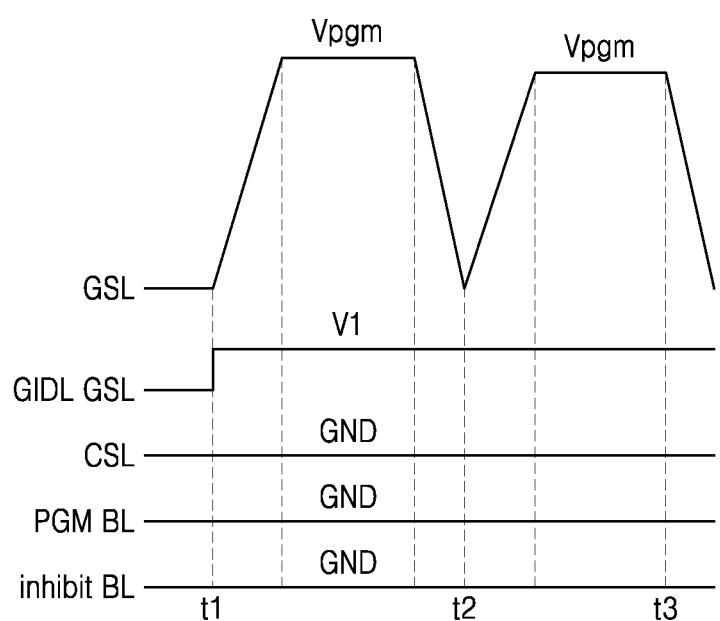
FIG. 7 is a timing diagram illustrating a method of programming a GSL cell according to an example embodiment of the present disclosure.

FIG. 7 is a timing diagram illustrating a method of programming a GSL cell according to an example embodiment of the present disclosure.

Referring to FIGS. 3 and 7 together, the program voltage Vpgm may be repeatedly applied to the GSL cell GSC. That is, unlike FIGS. 4 and 6, the verification operation for applying the verify voltage Vvfy may be omitted according to an example embodiment.

At a first time point t1, the program voltage Vpgm may be applied to the ground selection line GSL, and the first voltage V1 may be applied to the GIDL ground selection line GIDL GSL. The ground voltage GND may be applied to the common source line CSL, the first bit line BL1 to which the GSL cell GSC is connected, and the second bit line BL2 adjacent to the first bit line BL1.

Thereafter, at a second time point t2, the verification operation is omitted and the program operation may be repeatedly performed immediately. In this case, the level of the program voltage Vpgm applied at the second time point t2 may be the same as the level of the program voltage Vpgm applied at the first time point t1.

According to an example embodiment of the present disclosure, since the result of dividing the pass cell and the fail cell through the verification operation in FIGS. 4 and 6 does not affect the next program loop, the verification operation may be omitted.

Figure 8:
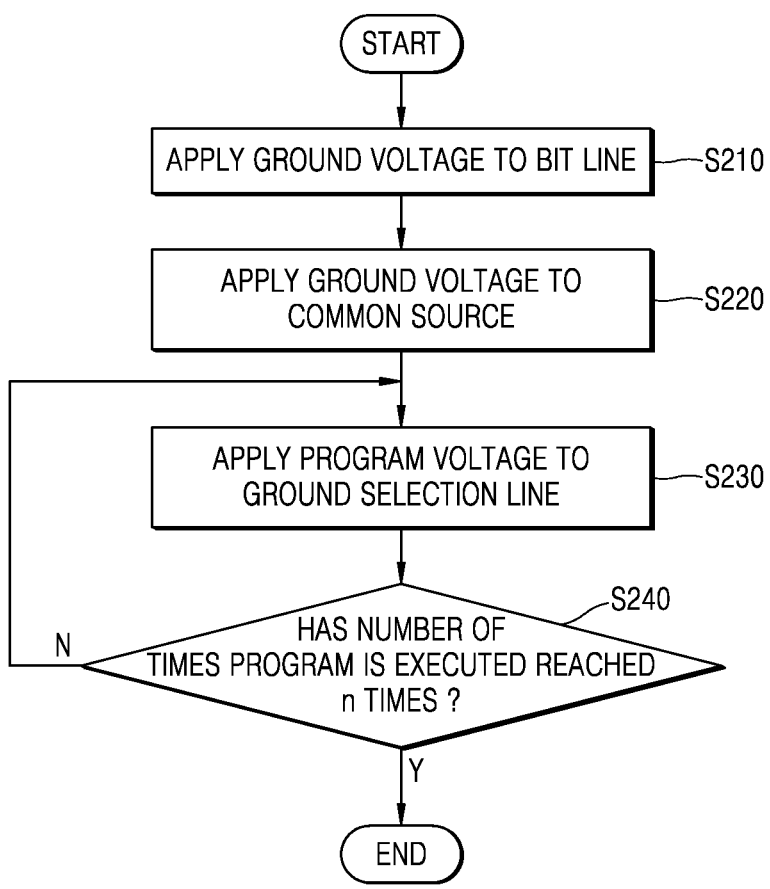
FIG. 8 is a flowchart illustrating a method of programming a GSL cell according to an example embodiment of the present disclosure.

FIG. 8 is a flowchart illustrating a method of programming a GSL cell according to an example embodiment of the present disclosure.

Referring to FIG. 8, a ground voltage may be applied to the bit line (S210). A ground voltage may be applied to the common source line (S220). The order in which operations S210 and S220 are performed is not limited to the order shown in FIG. 8. A program voltage may be applied to the ground selection line to which the GSL cell is connected (S230). It may be checked whether the number of times the program is executed on the ground selection line reaches n times (S240). That is, the program voltage may be repeatedly applied n times. In this case, the magnitude of the repeatedly applied program voltage may maintain a constant value. Unlike FIG. 6, the verification operation is omitted, and the program operation may be performed regardless of whether the GSL cell passes.

Figure 9:
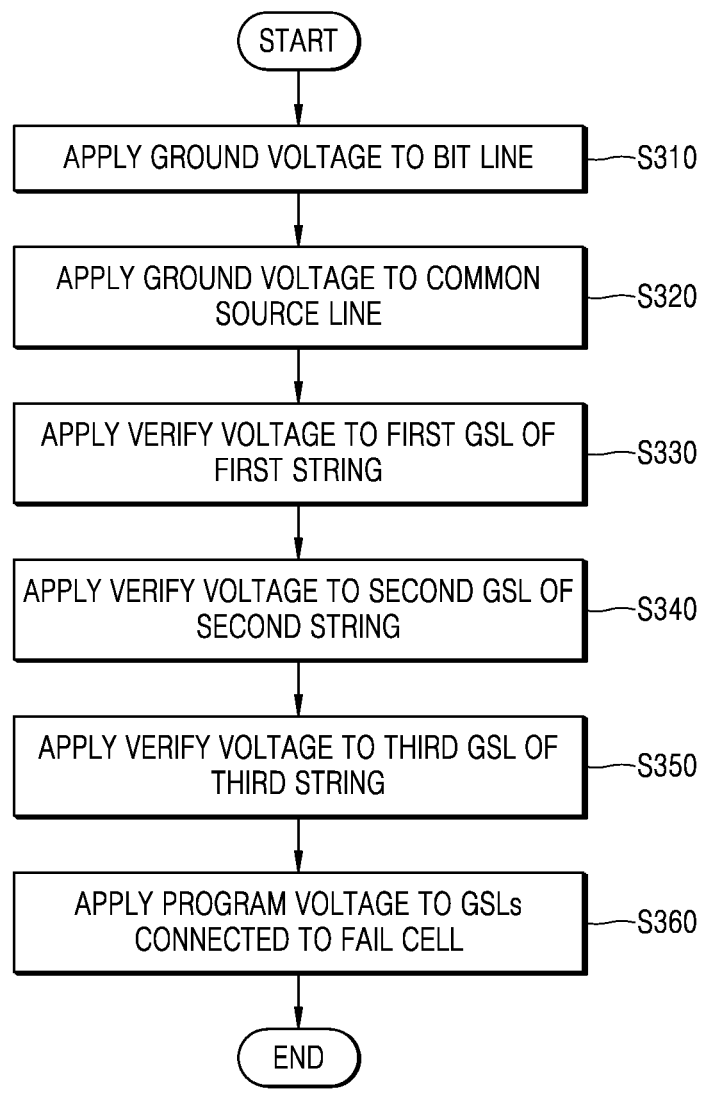
FIG. 9 is a flowchart illustrating a method of programming a GSL cell according to an example embodiment of the present disclosure.

FIG. 9 is a flowchart illustrating a method of programming a GSL cell according to an example embodiment of the present disclosure.

Referring to FIGS. 2 and 9 together, a plurality of cell strings may be connected to one bit line. For example, the first to third cell strings NS11 to NS31 may be connected to the first bit line BL1. The first to third cell strings NS11 to NS31 may include first to third GSL cells, respectively, and first to third ground selection lines GSL12 to GSL32 may be connected to the first to third GSL cells, respectively. According to an example embodiment, a verification operation may be sequentially performed on a plurality of cell strings, and a program operation may be performed at once or simultaneously. Before the verification operation is performed, it is assumed and described that a program operation is performed on the first to third GSL cells at least once.

A ground voltage may be applied to the bit line (S310). A ground voltage may be applied to the common source line (S320). The order in which operations S310 and S320 are performed is not limited to the order shown in FIG. 9. A verify voltage may be applied to the first ground selection line of the first string (S330). A verify voltage may be applied to the second ground selection line of the second string (S340). A verify voltage may be applied to the third ground selection line of the third string (S350). A pass cell and a fail cell may be determined through operations S330 to S350. A program voltage may be applied to at least one ground selection line connected to the fail cell among the cells at once (S360).

Figure 10:
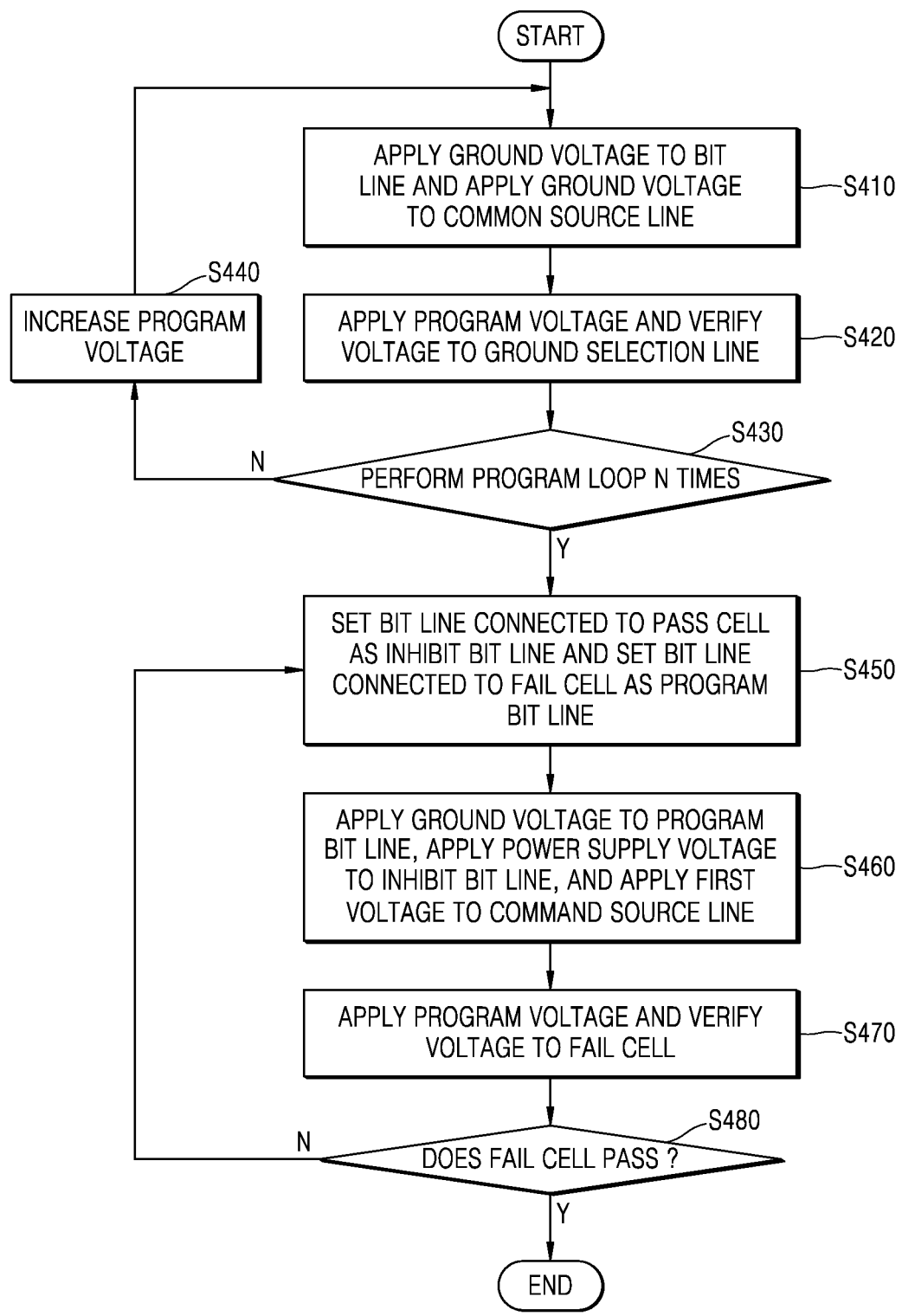
FIG. 10 is a flowchart illustrating a method of programming a GSL cell according to an example embodiment of the present disclosure.

FIG. 10 is a flowchart illustrating a method of programming a GSL cell according to an example embodiment of the present disclosure.

Referring to FIG. 10, after the n-th program loop is performed, an inhibit bit line to which a pass cell is connected may be distinguished from a program bit line to which a fail cell is connected according to a verification result.

A ground voltage may be applied to the bit line and the common source line (S410). A program voltage and a verify voltage may be sequentially applied to the ground selection line (S420). The program voltage and the verify voltage may constitute one program loop. It may be checked whether the program loop has been performed n times (S430). When the program loop is performed less than n times, the program voltage may be increased in operation S440 and the program loop may be repeatedly performed.

If the program loop is executed n times, according to the verification result, the bit line connected to the pass cell may be set as the inhibit bit line, and the bit line connected to the fail cell may be set as the program bit line, based on the n-th applied verify voltage (S450). A low voltage may be applied to the program bit line, a high voltage may be applied to the inhibit bit line, and a first voltage may be applied to the common source line (S460). For example, the low voltage may be a ground voltage, the high voltage may be a power supply voltage, and the first voltage may be about 6 V. A program voltage and a verify voltage may be sequentially applied to the fail cell connected to the inhibit bit line (S470).

An operation to determine whether the fail cell has passed is performed in operation S480, and if passed, the operation may be terminated. If the fail cell has not passed, operations after operation S450 may be performed again. In this case, the program voltage may be increased through a program loop similar to that described with reference to FIGS. 4 and 6.

According to an example embodiment of the present disclosure, the threshold voltage distribution of the GSL cell may be widened by performing n program loops without distinction between pass cells and fail cells. Therefore, by performing a program operation only on the fail cells after the n-th program loop, the distribution of the threshold voltages of all the GSL cells may be improved.

Figure 11:
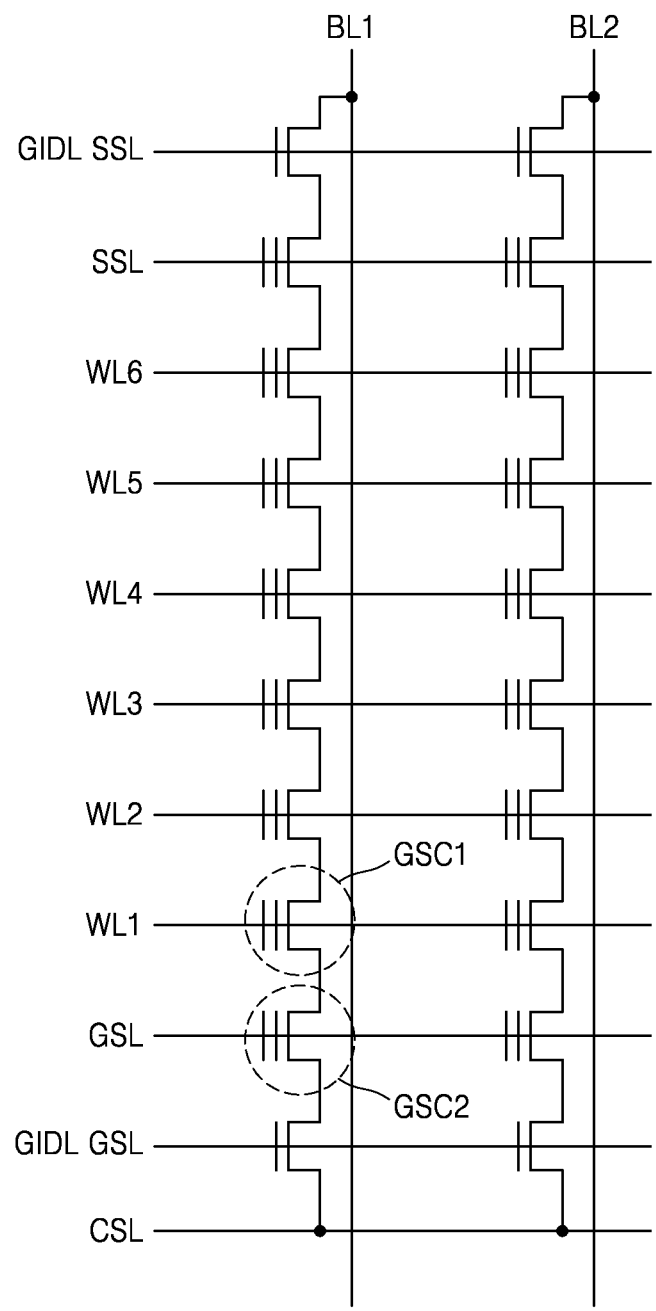
FIG. 11 is a circuit diagram illustrating a GSL cell according to an example embodiment of the present disclosure.

FIG. 11 is a circuit diagram illustrating a GSL cell according to an example embodiment of the present disclosure.

Referring to FIG. 11, a cell string may include a plurality of GSL cells. Accordingly, the cell string may be connected to the common source line CSL, the GIDL ground selection line GIDL GSL, the first and second ground selection lines GSL1 and GSL2, the first to fifth word lines WL1 to WL5, the string selection line SSL, and the GIDL string selection line GIDL SSL. As an example, the first ground selection line GSL1 may be referred to as an upper GSL or GSLu, and the second ground selection line GSL2 may be referred to as a lower GSL or GSLd.

A program operation may be performed in different ways on the first GSL cell GSC1 connected to the first ground selection line GSL1 and the second GSL cell GSC2 connected to the second ground selection line GSL2. For example, a program operation may be performed on the second GSL cell GSC2 located relatively closer to the common source line CSL by the method described with reference to FIGS. 6, 8, and 9. The program operation according to operations S450 to S480 of FIG. 10 may be performed on the first GSL cell GSC1 located relatively farther from the common source line CSL. For example, the method according to FIG. 12A may be applied to the first GSL cell GSC1 and the method according to FIG. 12B may be applied to the second GSL cell GSC2.

Figure 12A:
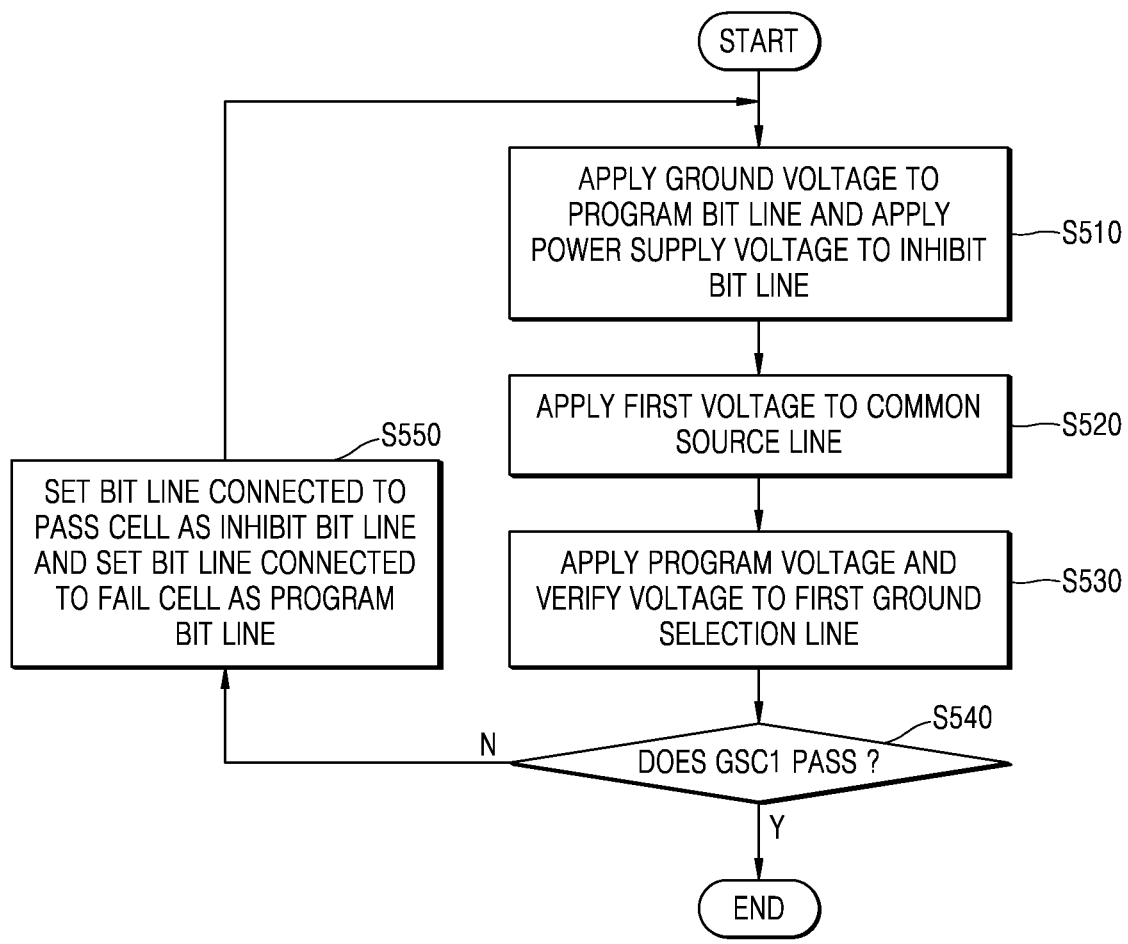
FIGS. 12A and 12B are flowcharts illustrating a method of programming a GSL cell according to an example embodiment of the present disclosure.
Figure 12B:
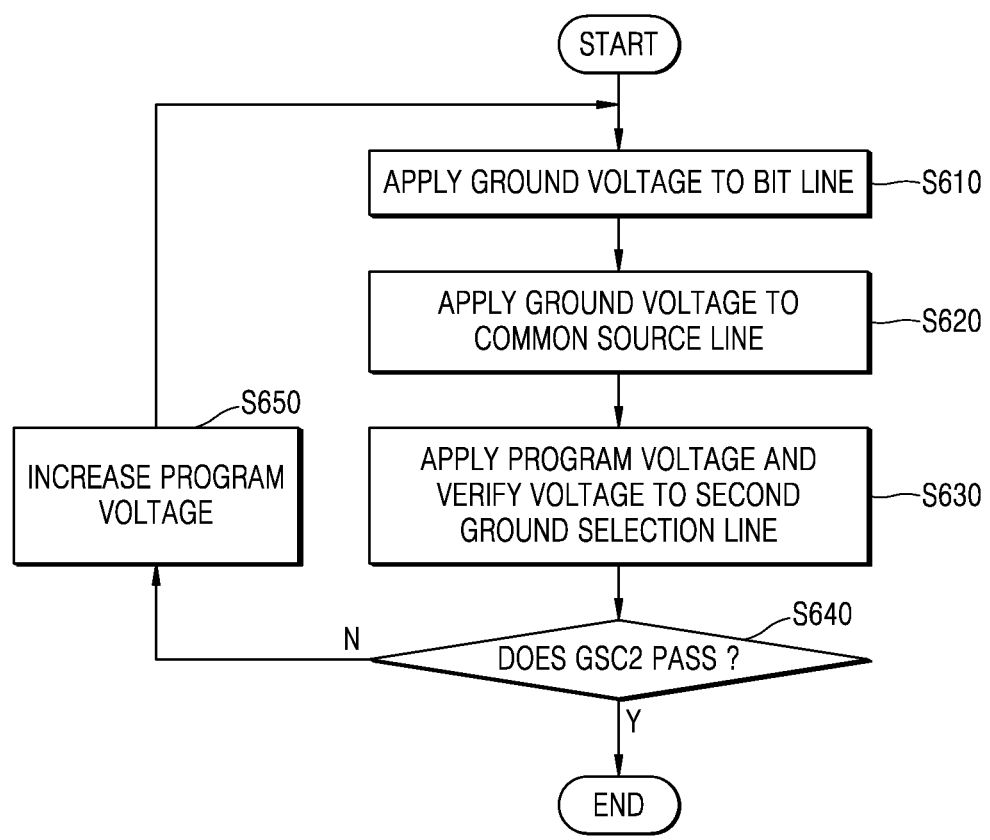

FIGS. 12A and 12B are flowcharts illustrating a method of programming a GSL cell according to an example embodiment of the present disclosure.

Referring to FIGS. 11 and 12A together, to program the first GSL cell GSC1, a ground voltage may be applied to the first bit line BL1, which is a program bit line, and a power voltage may be applied to the second bit line BL2, which is an inhibit bit line (S510). A first voltage, for example, about 1.5 V, may be applied to the common source line CSL (S520). In this case, a second voltage, for example, about 6 V, may be applied to the GIDL ground selection line GIDL GSL. A program voltage and a verify voltage may be sequentially applied to the first ground selection line GSL1 connected to the first GSL cell GSC1 (S530). As a result of applying the verify voltage, it may be checked whether the first GSL cell GSC1 passes (S540). If passed, the operation is terminated, and if failed, an operation of setting a bit line connected to a pass cell as an inhibit bit line and a bit line connected to a fail cell as a program bit line may be performed (S550).

Referring to FIGS. 11 and 12B together, the operation of programming the second GSL cell GSC2 may be similar to the operation described with reference to FIG. 6. That is, a ground voltage may be applied to the bit lines BL1 and BL2 and the common source line CSL (S610 and S620). In addition, a program voltage and a verify voltage may be sequentially applied to the second ground selection line GSL2 connected to the second GSL cell GSC2 (S630). As a result of the verification of the second GSL cell GSC2 in S630, when the second GSL cell GSC2 passes, the operation is terminated, and when the second GSL cell GSC2 fails, the program voltage is increased (S650). A program loop may be repeatedly performed.

Figure 13:
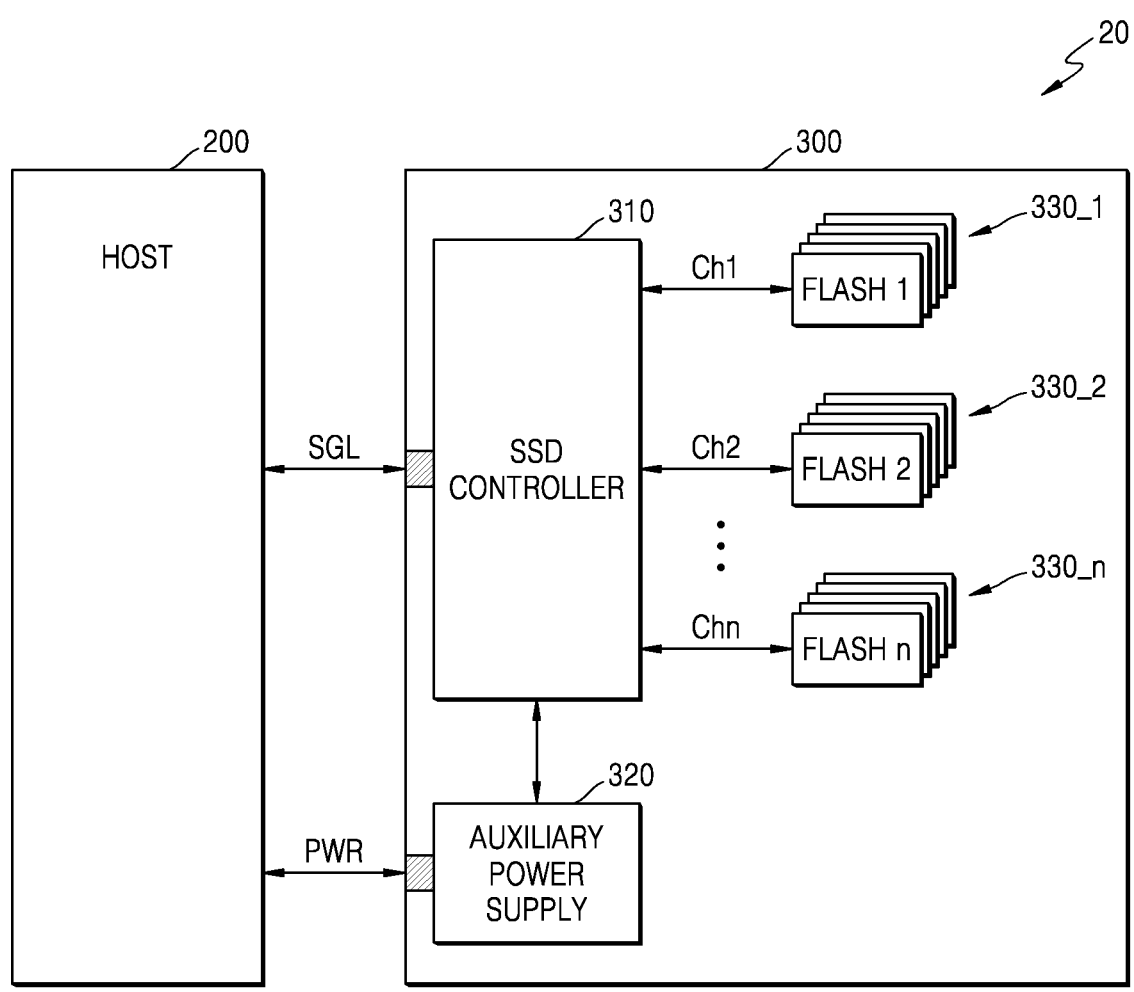
FIG. 13 is a block diagram illustrating a solid state drive (SSD) system according to an example embodiment of the present disclosure.

FIG. 13 is a block diagram illustrating a solid state drive (SSD) system according to an example embodiment of the present disclosure.

Referring to FIG. 13, an SSD system 20 may include a host 200 and an SSD 300. The SSD 300 may transmit and receive signals to and from the host 200 through a signal connector, and may receive power through a power connector. The SSD 300 may include an SSD controller 310, an auxiliary power supply 320, and memory devices 330_1 to 330_n.

An operation of programming the GSL cell may be performed in each of the memory devices 330_1 to 330_n. In this case, as described with reference to FIGS. 1 to 12, the program operation and the verification operation of the GSL cell may be performed, and the program operation may be repeatedly performed regardless of the verification result. That is, according to example embodiments, to form the threshold voltage distribution of the GSL cells, the verification result is not used. By not distinguishing the program cell and the inhibit cell, the program bit line, and the inhibit bit line from each other, the same voltage is applied to the bit line, thereby preventing the occurrence of a short path.

As is traditional in the field of the present disclosure, example embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

While the present disclosure has been particularly shown and described with reference to embodiments thereof, it will be understood by those of ordinary skill in the art that various changes in form and detail may be made therein without departing from the spirit and scope of the present disclosure as defined by the following claims.

What is claimed is:

1. A program method, comprising:
applying a first voltage to a plurality of bit lines;
applying a second voltage to a common source line (CSL);
performing a program loop by applying a program voltage and a verify voltage to each of a plurality of ground selection lines (GSLs) positioned between one bit line among the plurality of bit lines and the CSL,
wherein the program loop is performed on both a program completed cell in which a program is completed by applying the program voltage and a program target cell;
determining whether GSL cells respectively connected to the GSLs pass; and
increasing the program voltage when there is at least one fail cell among the GSL cells, and repeatedly performing the program loop on the plurality of GSLs based on the increased program voltage by applying the first voltage to an inhibit bit line connected to a pass cell among the GSL cells and to a program bit line connected to at least one fail cell among the GSL cells without distinguishing between the inhibit bit line and the program bit line.

2. The program method of claim 1, wherein the first and second voltages each comprise a ground voltage.

3. The program method of claim 1, wherein the first voltage comprises a ground voltage.

4. The program method of claim 1, wherein the second voltage comprises a ground voltage.

5. The program method of claim 1, wherein repeatedly performing the program loop comprises:
applying the verify voltage to a first GSL of a first cell string and a second GSL of a second cell string, respectively, with respect to the first cell string and the second cell string connected to the plurality of bit lines.

6. The program method of claim 5, wherein repeatedly performing the program loop comprises:
simultaneously applying the increased program voltage to the first and second GSLs.

7. The program method of claim 1, further comprising:
determining first pass cells and first fail cells among the GSL cells based on a result of repeatedly performing the program loop;
applying a third voltage to an inhibit bit line connected to the first pass cells;
applying the first voltage to a program bit line connected to the first fail cells;
applying a fourth voltage to the CSL; and
performing the program loop on the first fail cells.

8. The program method of claim 7, wherein the first voltage and the second voltage each comprise a ground voltage.

9. The method of claim 8, wherein the third voltage comprises a power supply voltage.

* * * * *